(12) United States Patent
Noorbakhsh et al.

(10) Patent No.: US 10,943,808 B2
(45) Date of Patent: Mar. 9, 2021

(54) CERAMIC ELECTROSTATIC CHUCK HAVING A V-SHAPE SEAL BAND

(71) Applicant: Applied Materials, Inc., Santa Clara, CA (US)

(72) Inventors: Hamid Noorbakhsh, Fremont, CA (US); Ippei Nakagawa, Gojo (JP); Nobuhiro Yoshida, Gojo (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/361,365

(22) Filed: Nov. 25, 2016

(65) Prior Publication Data

US 2018/0151402 A1    May 31, 2018

(51) Int. Cl.
*H01L 21/67* (2006.01)
*H01L 21/683* (2006.01)
*H01L 21/687* (2006.01)

(52) U.S. Cl.
CPC .... *H01L 21/6833* (2013.01); *H01L 21/67109* (2013.01); *H01L 21/67126* (2013.01); *H01L 21/6831* (2013.01); *H01L 21/68785* (2013.01); *H01L 21/67103* (2013.01)

(58) Field of Classification Search
CPC ........... H01L 21/6833; H01L 23/67103; H01L 21/67109; H01L 21/6831
USPC .................................................. 277/395, 647
See application file for complete search history.

(56) References Cited

U.S. PATENT DOCUMENTS 2,547,185 A   4/1951  Von Bolhar
3,825,272 A   7/1974  Townsend
2008/0193068 A1  8/2008  Petri
2009/0014323 A1  1/2009  Yendler et al.
2010/0027188 A1  2/2010  Liu et al.
(Continued)

FOREIGN PATENT DOCUMENTS

JP    S53149218 U   11/1978
JP    S61009644 U    1/1986
(Continued)

OTHER PUBLICATIONS

International Search Report and Written Opinion for PCT/US2017/053470 dated Jan. 5, 2018.

(Continued)

*Primary Examiner* — Eric A. Gates
*Assistant Examiner* — Paul M Janeski
(74) *Attorney, Agent, or Firm* — Patterson + Sheridan, LLP

(57) ABSTRACT

Implementations described herein provide a substrate support assembly that includes a seal band. The seal band protects an adhesive layer that is disposed between an electrostatic chuck (ESC) and a cooling plate of the substrate support assembly. In one example, a substrate support assembly includes an electrostatic chuck and a cooling plate. A bonding layer secures a bottom surface of the electrostatic chuck to a top surface of the cooling plate. The bonding layer has an adhesive layer and a seal band. The seal band circumscribes and protects the adhesive layer. The seal band has a ring shaped body. The ring shaped body has a top surface connected to a bottom surface by an inner surface and an outer surface. The top surface and the bottom surface angled less than 85 degrees from the inner surface. The outer surface has an indent formed therein.

20 Claims, 3 Drawing Sheets

(56) References Cited

U.S. PATENT DOCUMENTS

| | | | |
|---|---|---|---|
| 2011/0253667 A1* | 10/2011 | Hiss | B65D 39/025 |
| | | | 215/355 |
| 2013/0097840 A1 | 4/2013 | Schaefer et al. | |
| 2013/0286530 A1 | 10/2013 | Lin et al. | |
| 2014/0065835 A1 | 3/2014 | Kadkhodayan et al. | |
| 2015/0170942 A1 | 6/2015 | Chhatre et al. | |
| 2015/0183187 A1 | 7/2015 | Lin et al. | |
| 2019/0242480 A1 | 8/2019 | Nakagawa et al. | |

FOREIGN PATENT DOCUMENTS

| | | | |
|---|---|---|---|
| JP | 2005083414 A | 3/2005 |
| JP | 2015515760 A | 5/2015 |
| WO | 2008048518 A1 | 4/2008 |
| WO | 2013162641 A1 | 10/2013 |

OTHER PUBLICATIONS

International Preliminary Report on Patentability from PCT/JP2017/031907.

International Search Report dated Nov. 28, 2017 from PCT/JP2017/031907.

* cited by examiner

CERAMIC ELECTROSTATIC CHUCK HAVING A V-SHAPE SEAL BAND

BACKGROUND

Field

Implementations described herein generally relate to semiconductor manufacturing and more particularly to a substrate support assembly suitable for high temperature semiconductor manufacturing.

Description of the Related Art

Reliably producing nanometer and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

To drive down manufacturing cost, integrated chip (IC) manufactures demand higher throughput and better device yield and performance from every silicon substrate processed. Conventional electrostatic chucks (ESC) are typically bonded to a cooling plate in a substrate support assembly. The bond may be protected with a seal. However, the seals only provide a marginal protection due to a minimal surface contact between the ESC and the cooling plate. The electrostatic chuck may experience bonding problems within the substrate support assemblies due to fluorine radical penetration etching away the bonding layer once the seal has been compromised. Loss of bond material accelerates delamination of the ESC from the cooling plate. Additionally, a compromised seal may cause the bond material to outgas into the processing volume, thereby causing contamination in the chamber. The chamber may require down time to repair or replace the substrate support assembly, effecting costs, yield and performance.

Thus, there is a need for an improved substrate support assembly.

SUMMARY

Implementations described herein provide a substrate support assembly having a seal band protecting a bonding layer. The substrate support assembly includes an electrostatic chuck having a workpiece supporting surface and a bottom surface, and a cooling plate having a top surface and a bonding layer securing the bottom surface of the electrostatic chuck and the top surface of the cooling plate. The bonding layer has an adhesive layer and a seal band circumscribing the adhesive layer. The seal band provides a seal between the electrostatic chuck and the cooling plate. The seal band has a ring shaped body. The body has an inner surface, a top surface and a bottom surface connected by the inner surface to the top surface, and an outer surface. The top surface and the bottom surface are angled less than 85 degrees from the inner surface. The outer surface has an indent formed therein. The outer surface connects the top surface to the bottom surface.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Implementations described herein provide a substrate support assembly that includes a seal band. The seal band protects an adhesive layer that is disposed between an electrostatic chuck (ESC) and a cooling plate of the substrate support assembly. The seal band is particularly advantageous for ESC applications that are exposed to high temperature operation. High temperature is intended to refer to temperatures in excess of about 150 degrees Celsius, for example, temperatures in excess of about 250 degrees Celsius, such as temperatures of about 250 degrees Celsius to about 300 degrees Celsius. The seal band is disposed on the outer perimeter of the bonding layer to prevent the bonding material from outgassing or being attacked by the harsh chamber environment. The seal band is configured to have increased contact area for maintaining the integrity and longevity of the seal. Although the substrate support assembly is described below in an etch processing chamber, the substrate support assembly may be utilized in other types of plasma processing chambers, such as physical vapor deposition chambers, chemical vapor deposition chambers, ion implantation chambers, among others, and other systems where protection of the bonding layer is desirable.

Figure 1:
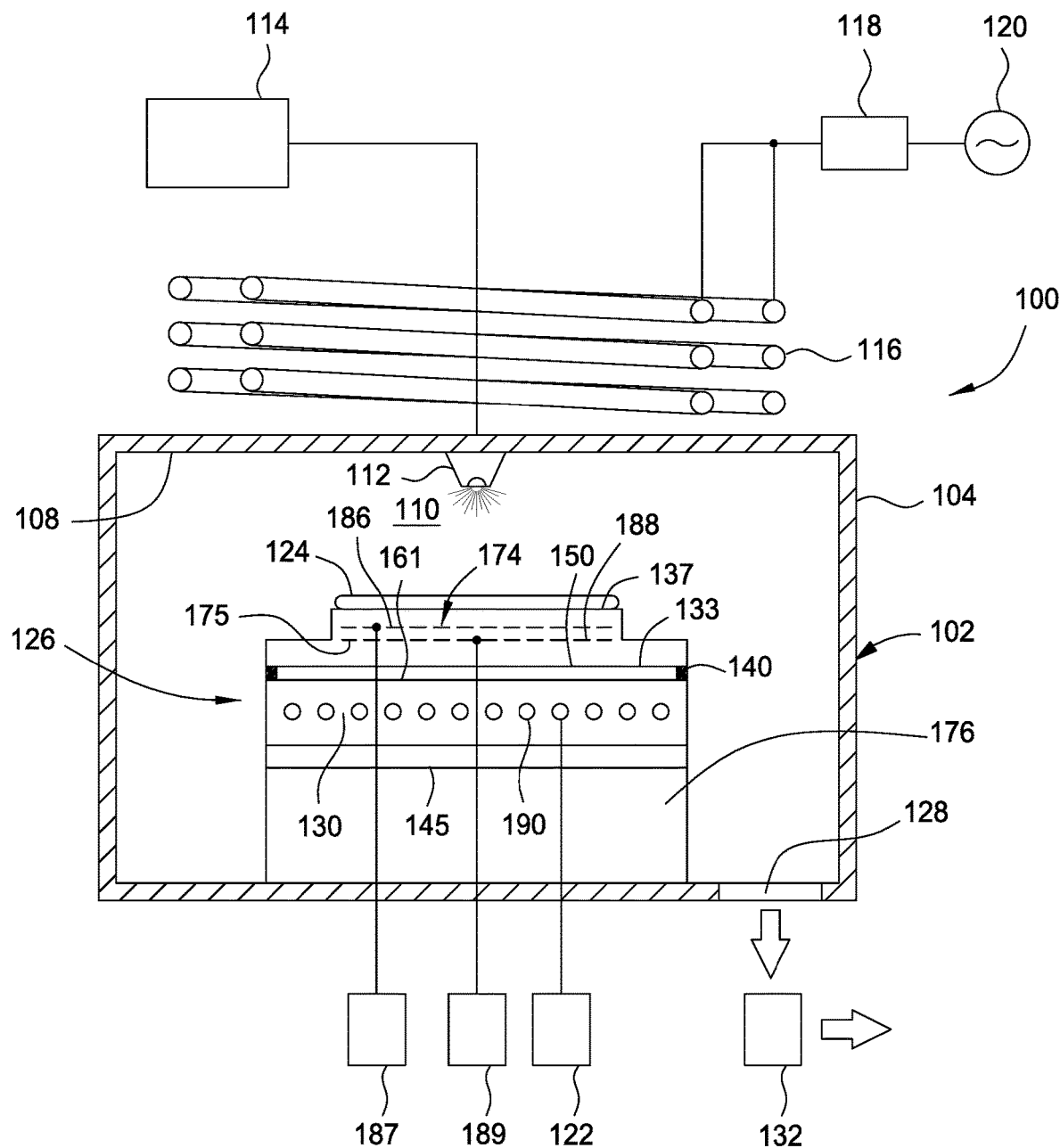
FIG. 1 is a cross-sectional schematic side view of a processing chamber having one embodiment of a substrate support assembly.

FIG. 1 is a cross-sectional schematic view of an exemplary plasma processing chamber 100, shown configured as an etch chamber, having a substrate support assembly 126. The substrate support assembly 126 may be utilized in other types of processing plasma chambers, for example plasma treatment chambers, annealing chambers, physical vapor deposition chambers, chemical vapor deposition chambers, and ion implantation chambers, among others, as well as other systems where the ability to control processing uniformity for a surface or workpiece, such as a substrate, is desirable. Control of the dielectric properties tan(δ), i.e., dielectric loss, or ρ, i.e., the volume resistivity, for the substrate support at elevated temperature ranges and beneficially enables azimuthal processing uniformity for a substrate 124 thereon.

The plasma processing chamber 100 includes a chamber body 102 having sidewalls 104, a bottom 106 and a lid 108 that enclose a processing region 110. An injection apparatus 112 is coupled to the sidewalls 104 and/or lid 108 of the chamber body 102. A gas panel 114 is coupled to the injection apparatus 112 to allow process gases to be provided into the processing region 110. The injection apparatus 112 may be one or more nozzle or inlet ports, or alternatively a showerhead. Processing gas, along with any processing by-products, are removed from the processing region 110 through an exhaust port 128 formed in the sidewalls 104 or bottom 106 of the chamber body 102. The exhaust port 128 is coupled to a pumping system 132, which includes throttle valves and pumps utilized to control the vacuum levels within the processing region 110.

The processing gas may be energized to form a plasma within the processing region 110. The processing gas may be energized by capacitively or inductively coupling RF power to the processing gases. In the embodiment depicted in FIG. 1, a plurality of coils 116 are disposed above the lid 108 of the plasma processing chamber 100 and coupled through a matching circuit 118 to an RF power source 120.

The substrate support assembly 126 is disposed in the processing region 110 below the injection apparatus 112. The substrate support assembly 126 includes an electrostatic chuck 174 and a cooling plate 130. The cooling plate 130 is supported by a base plate 176. The base plate 176 is supported by one of the sidewalls 104 or bottom 106 of the processing chamber. The substrate support assembly 126 may additionally include a heater assembly (not shown). Additionally, the substrate support assembly 126 may include a facility plate 145 and/or an insulator plate (not shown) disposed between the cooling plate 130 and the base plate 176.

The cooling plate 130 may be formed from a metal material or other suitable material. For example, the cooling plate 130 may be formed from aluminum (Al). The cooling plate 130 may include cooling channels 190 formed therein. The cooling channels 190 may be connected to a heat transfer fluid source 122. The heat transfer fluid source 122 provides a heat transfer fluid, such as a liquid, gas or combination thereof, which is circulated through one or more cooling channels 190 disposed in the cooling plate 130. The fluid flowing through neighboring cooling channels 190 may be isolated to enabling local control of the heat transfer between the electrostatic chuck 174 and different regions of the cooling plate 130, which assists in controlling the lateral temperature profile of the substrate 124. In one embodiment, the heat transfer fluid circulating through the cooling channels 190 of the cooling plate 130 maintains the cooling plate 130 at a temperature between about 90 degrees Celsius and about 80 degrees Celsius, or at a temperature lower than 90 degrees Celsius.

The electrostatic chuck 174 includes a chucking electrode 186 disposed in a dielectric body 175. The dielectric body 175 has a workpiece support surface 137 and a bottom surface 133 opposite the workpiece support surface 137. The dielectric body 175 of the electrostatic chuck 174 may be fabricated from a ceramic material, such as alumina (Al$_2$O$_3$), aluminum nitride (AlN) or other suitable material. Alternately, the dielectric body 175 may be fabricated from a polymer, such as polyimide, polyetheretherketone, polyaryletherketone and the like.

The dielectric body 175 may also include one or more resistive heaters 188 embedded therein. The resistive heaters 188 may be provided to elevate the temperature of the substrate support assembly 126 to a temperature suitable for processing a substrate 124 disposed on the workpiece support surface 137 of the substrate support assembly 126. The resistive heaters 188 are coupled through the facility plate 145 to a heater power source 189. The heater power source 189 may provide 900 watts or more power to the resistive heaters 188. A controller (not shown) may control the operation of the heater power source 189, which is generally set to heat the substrate 124 to a predefined temperature. In one embodiment, the resistive heaters 188 include a plurality of laterally separated heating zones, wherein the controller enables at least one zone of the resistive heaters 188 to be preferentially heated relative to the resistive heaters 188 located in one or more of the other zones. For example, the resistive heaters 188 may be arranged concentrically in a plurality of separated heating zones. The resistive heaters 188 may maintain the substrate 124 at a temperature suitable for processing. In some embodiments utilizing elevated processing temperatures, the resistive heaters 188 may maintain the substrate 124 at a temperature between about 180 degrees Celsius to about 500 degrees Celsius.

The electrostatic chuck 174 generally includes a chucking electrode 186 embedded in the dielectric body 175. The chucking electrode 186 may be configured as a mono polar or bipolar electrode, or other suitable arrangement. The chucking electrode 186 is coupled through an RF filter to a chucking power source 187, which provides a RF or DC power to electrostatically secure the substrate 124 to the workpiece support surface 137 of the electrostatic chuck 174. The RF filter prevents RF power utilized to form a plasma (not shown) within the plasma processing chamber 100 from damaging electrical equipment or presenting an electrical hazard outside the chamber.

The workpiece support surface 137 of the electrostatic chuck 174 may include gas passages (not shown) for providing backside heat transfer gas to the interstitial space defined between the substrate 124 and the workpiece support surface 137 of the electrostatic chuck 174. The electrostatic chuck 174 may also include lift pin holes for accommodating lift pins (not shown) for elevating the substrate 124 above the workpiece support surface 137 of the electrostatic chuck 174 to facilitate robotic transfer into and out of the plasma processing chamber 100.

A bonding layer 150 is disposed between the electrostatic chuck 174 and the cooling plate 130. The bonding layer 150 may be formed from several layers which provide for different thermal expansions of the electrostatic chuck 174 and the cooling plate 130. The bonding layer 150 includes an adhesive layer (shown as 308 in FIG. 3) and a seal band 140. The seal band 140 is configured to protect the adhesive material forming the adhesive layer of bonding layer 150 disposed between the electrostatic chuck 174 and the cooling plate 130 from the gases and plasma present in the processing region 110.

Figure 2B:
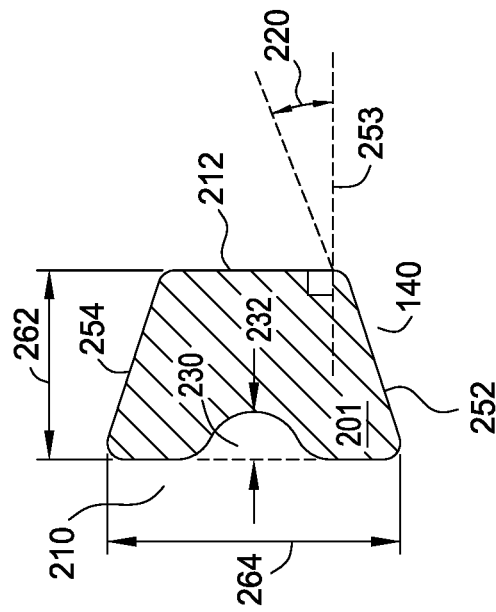
FIG. 2B is a cross sectional view of the seal taken across section line B-B in FIG. 2A.
Figure 2A:
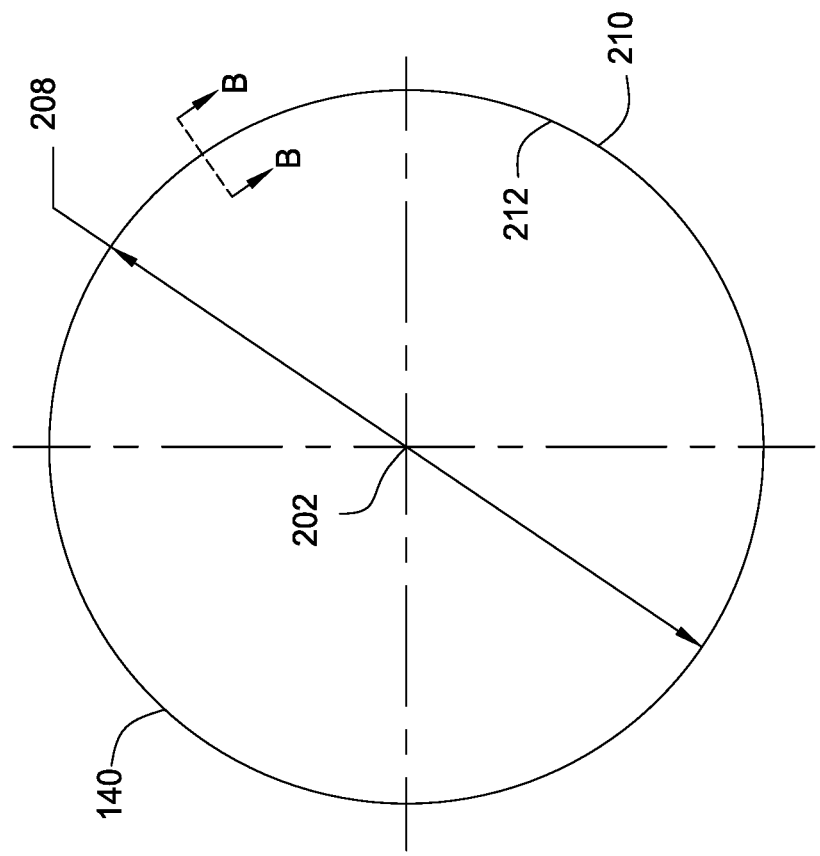
FIG. 2A is a top plan view of a seal for the substrate support assembly.

FIG. 2A is a top plan view of the seal band 140. The seal band 140 has a ring shaped body 201. The ring shaped body 201 has a center 202 about which the seal band 140 is substantially congruent. The ring shaped body 201 has an inner surface 212 and an outer surface 210. The outer surface 210 of the ring shaped body 201 has a diameter 208 that defines the outside diameter of the seal band 140. In one embodiment, the diameter 208 may be between about 306 mm and about 310 mm, such as about 308 mm. In another embodiment, the diameter 208 may be between about 206 mm and about 210 mm, such as about 208 mm. In yet another embodiment, the diameter 208 may be between about 456 mm and about 460 mm, such as about 458 mm.

The seal band 140 may be formed from a soft elastomeric material, for example, having a Shore D hardness of between about 60 and about 80, such as about 72. The seal band 140 may additionally have a tensile strength between about 10 Mpa and about 15 Mpa, such as about 11.1 Mpa. The elastomeric material forming the seal band 140 may be elongated to about 160% of its original size prior to breaking. The seal band 140 may be formed from a high performance elastomer such as a tetrafluoro ethylene/propylene, a perfluoroelastomer such as Fluoritz-TR® or Perlast G67P®, or other suitable material. In one embodiment, the seal band 140 is formed from Fluoritz-TR®. The material of the seal band 140 is void of fillers and is resistant to fluorine and oxygen chemistries for enhanced resistance to cracking and plasma radicals. The absence of filler material prevents premature crack formation that happens to conventional filled seals at the filler's material boundaries where the base elastomer has etched away. There may be an increase in the material erosion rate in absence of the filler material, but the larger contact and absence of cracks beneficially improves the service life of the seal band 140.

FIG. 2B is a cross sectional view of the seal band 140 taken across section line B-B in FIG. 2A. The seal band 140 has a top surface 254 and a bottom surface 252. The top surface 254 and the bottom surface 252 are connected by the inner surface 212. An imaginary normal line 253 may be disposed at 90° from the inner surface 212. An angle 220 may be formed between the imaginary normal line 253 and the bottom surface 252. The top surface 254 may be similarly angled with the imaginary normal line 253 as the bottom surface 252. The angled 220 may be between about 10 degrees and about 30 degrees, such as about 20 degrees. Thus, the top surface 254 and the bottom surface 252 may have an angled 221 from the inner surface 212 of between about 100° and about 120°, such as more than about 110°. The top surface 254 and the bottom surface 252 may have a length 262 measured along the normal between the inner surface 212 and the outer surface 210. The length 262 may be between about 1.55 mm and about 1.25 mm such as about 1.40 mm.

The outer surface 210 may have a height 264 extending between the top surface 254 to the bottom surface 252. The height 264 may be between about 2.075 mm and about 2.125 mm such as about 2.100 mm. The outer surface 210 may have an indent 230 formed therein. The indent 230 may produce a V-shaped profile for the seal band 140. The indent 230 may have a depth 232 between about 0.30 mm and about 0.50 mm such as about 0.40 mm. The indent 230 permits the seal band 140 to be easily compressed for ease of installation, and to orientate the top surface 254 and bottom surface 252 in a substantially parallel orientation that enhances the contact area with the electrostatic chuck 174 and the cooling plate 130 when making a seal therebetween when disposed in the substrate support assembly 127. In one embodiment, the seal band 140 is symmetrical about an imaginary line bifurcating the indent 230 and inner surface 212.

Figure 3:
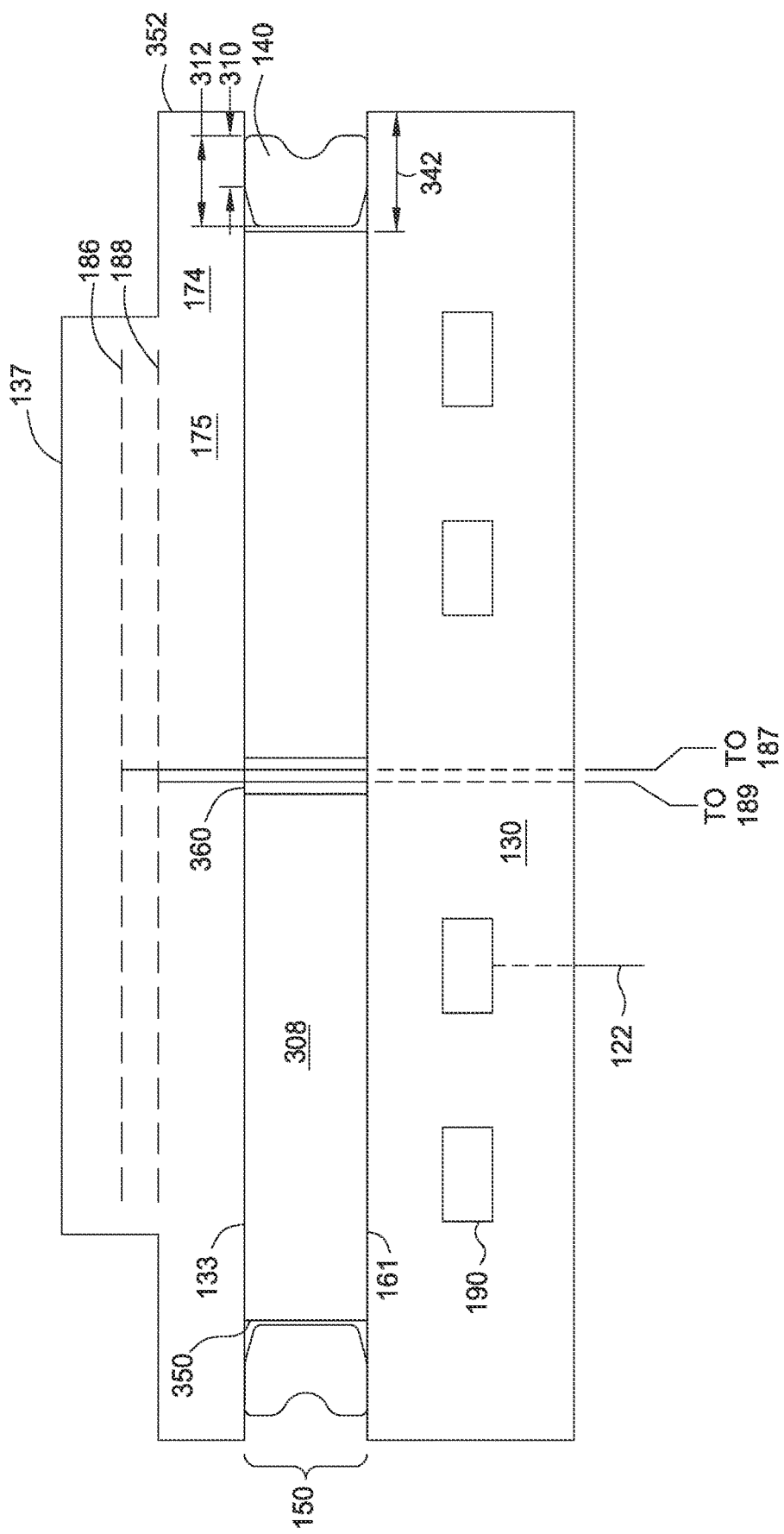
FIG. 3 is a partial cross-sectional schematic side view of the substrate support assembly detailing one embodiment of the seal disposed between an electrostatic substrate support and a cooling plate.

Use of the seal band 140 in the substrate support assembly 127 will now be discussed relative to FIG. 3. FIG. 3 is a partial cross-sectional schematic side view of the substrate support assembly 126 detailing one embodiment of the seal band 140 disposed between an electrostatic chuck 174 and the cooling plate 130. The bonding layer 150 disposed between the electrostatic chuck 174 and the cooling plate 130 may be formed from different materials. An electrical socket 360 may provide connections to the resistive heaters 188 and chucking electrode 186 embedded in the dielectric body 175. The resistive heaters 188 may heat the bottom 133 of the electrostatic chuck 174 to temperatures above 250° Celsius. The bonding layer 150 may extend to about an outer diameter 352 of the electrostatic chuck 174 or the cooling plate 130. The bonding layer 150 is flexible to account for thermal expansion between the electrostatic chuck 174 and the cooling plate 130, to substantially prevent cracking, and to reduce the potential for the electrostatic chuck 174 delaminating from the cooling plate 130.

The bonding layer 150 includes at least one adhesive layer 308. The adhesive layer 308 may be formed from a perfluoro compound, silicone, porous graphite, an acrylic compound, perfluoromethyl vinyl ether, alkoxy vinyl ether, CIRLEX®, TEFZEL®, KAPTON®, VESPEL®, KERIMID®, polyethylene, or other suitable material. The adhesive layer 308 may have a thickness 302 of about 1 mm to about 5 mm, such as about 1.75 mm. The adhesive layer 308 may have a thermal conductivity between about 0.1 W/mK and about 1 W/mK, such as about 0.17 W/mK.

A notch 342 is formed between an outer periphery 350 of the adhesive layer 308 and the outer diameter 352 of the electrostatic chuck 174. The diameter 208 of the seal band 140 is less than the outer diameter 352 of the electrostatic chuck 174. Additionally, the diameter 208 of the seal band 140 is less than the outer diameter of the cooling plate 130. The seal band 140 disposed about, i.e., circumscribes, the outer periphery 350 of the adhesive layer 308. The notch 342 may be sized to permit the seal band 140 to sealingly engage the electrostatic chuck 174 and cooling plate 130. Although the seal band 140 may optionally form a vacuum tight seal between the electrostatic chuck 174 and the cooling plate 130, the primary function of the seal is to protect the exposed outer periphery 350 of the adhesive layer 308 from the environment within the processing region 110.

In one embodiment, the seal band 140 prevents the process gas exposure to the bond material (adhesive layer 308) of the substrate support assembly 126. That is, the seal band 140 protects the inner portions of the substrate support assembly 126 from exposure to the plasma environment. The seal band 140 prevents volatized gases from the adhesive layer 308 from contaminating the plasma environment. The seal band 140 protects the adhesive layer 308 and other internal structures of the substrate support assembly 127 from the plasma environment.

The seal band 140 may be V-shaped. The shape of the seal band 140 provides a contact surface 310 for sealing which is substantially larger than conventional O-ring seals. Additionally, the V-shaped provides for easier installation of the seal band 140. For example, the force required to install the seal band 140, having the V-shaped, is decreased by about 40% compared to the force required to install a conventional O-ring. For example, at 0° Celsius, the seal band 140 has an installation force of about 0.63 N/mm whereas conventional O-rings have an installation force of about 1.00 N/mm. The contact surface 310 of the seal band 140, having the V-shaped, is substantially larger (in width) compared to the contact area of traditional O-rings. For example, the contact surface 310 of the seal band 140 is about 30% greater than the contact area of conventional O-rings. As the temperature increases from 0 degrees Celsius to 50 degrees Celsius, the contact surface 310 of the seal band 140 increases from about 0.62 mm to about 0.74 mm.

After installation, a compression load on the seal band 140 varies with the temperature of the seal band 140. In operation, the seal band 140 may be compressed as much as 20%. The increase in compression of the seal band 140 at the higher temperature improves the seal-ability even after some erosion. The erosion profile of the seal band 140 may be indicative of the longevity for the seal band 140. The erosion profile at 800 RF hours and 1700 RF hours have shown little wear requiring replacement of the seal band 140. The compression load is not linear as thermal expansion of the seal band 140 leads to an increase squeeze of the seal band 140 resulting in an increase compression load. At the same time, the material of the seal band 140 is softened by the heat and results in a decrease in the compression load. For example, at 0 degrees Celsius, the compression load on the seal band 140 is about 0.23 N/mm; at 25 degrees Celsius, the compression load on the seal band 140 increases to about 0.26 N/mm; and at 50 degrees Celsius, the compression load on the seal band 140 decreases to about 0.15 N/mm.

The resistance of the seal band 140 to initial cracking was tested on a metallic drum. The seal band 140 was stretched 28% on the metallic drum. The seal band 140 was exposed to plasma having $O_2$ and $CF_4$ flowing at a 196:4 ratio by weight. The seal band 140 formed from Fluoritz-TR demonstrated a greater than 100% increase in longevity from cracking compared to seal bands 140 formed from Fluoritz-T20, transparent perfluoro-elastomers (FFKM) B or D, white FFKM F, K or L, and POR. Additionally, the weight loss due to erosion was less than all the aforementioned materials except for Fuoritz-T20. Advantageously, the compression load and material of the seal band 140 significantly reduced cracking which may compromise the seal. For example, after 320 RF hours and 600 RF hours, the seal band 140 formed from Fluoritz-TR had no visible signs of erosion or cracking.

Advantageously, the seal band 140 having a V-shaped substantially prevents cracking or degradation of the seal from harsh radical chemistries in the processing chamber, such as fluorine radicals penetrating and etching away the seal protecting the bonding layer. The seal band 140 having a V-shaped substantially minimizes the degradation of the bond between the ESC and the cooling plate while substantially preventing volatiles outgassing from the bonding layer from entering the processing environment. Thus, the seal band 140 having a V-shaped prevents contamination in the chamber and reduces chamber downtime which may affect process yields and costs of operations.

While the foregoing is directed to implementations of the present invention, other and further implementations of the invention may be devised without departing from the basic scope thereof, and the scope thereof is determined by the claims that follow.

What is claimed is:

1. A substrate support assembly, comprising:
   an electrostatic chuck having a workpiece supporting surface and a bottom surface;
   a cooling plate having a top surface; and
   a bonding layer securing the bottom surface of the electrostatic chuck and the top surface of the cooling plate, wherein the bonding layer comprises:
   an adhesive layer; and
   a seal band circumscribing the adhesive layer and contacting the electrostatic chuck and the cooling plate, the seal band having a ring shaped body, the ring shaped body comprising:
   an inner surface;
   a top surface and a bottom surface, each of the top surface and the bottom surface extend from the inner surface at an angle of more than 110° from the inner surface, wherein about 40% to about 60% of a length of the top surface is configured to abut the bottom surface of the electrostatic chuck; and
   an outer surface having an indent formed therein, the outer surface connecting the top surface to the bottom surface.

2. The substrate support assembly of claim 1, wherein the ring shaped body of the seal band further comprises:
   a profile having a V-shaped.

3. The substrate support assembly of claim 1, wherein the seal band further comprises:
   a diameter of between about 306 mm and about 310 mm.

4. The substrate support assembly of claim 3, wherein the ring shaped body may be elongated to about 160% prior to breaking.

5. The substrate support assembly of claim 1, wherein the ring shaped body has a Shore D hardness of between about 60 and 80.

6. The substrate support assembly of claim 1, wherein the ring shaped body has a tensile strength between about 10 Mpa and about 15 Mpa.

7. The substrate support assembly of claim 1, wherein the ring shaped body is formed from tetrafluoro ethylene/propylene or a perfluoroelastomer.

8. The substrate support assembly of claim 7, wherein a material of the seal band is void of fillers and resistant to fluorine and oxygen chemistries.

9. The substrate support assembly of claim 1, wherein a compression load on the seal band at 0° Celsius is about 0.23 N/mm, at 25° Celsius the compression load on the seal band is about 0.26 N/mm, and at 50° Celsius the compression load on the seal band is about 0.15 N/mm.

10. The substrate support assembly of claim 1 further comprising:
    a notch formed between an outer periphery of the adhesive layer and an outer diameter of the electrostatic chuck, wherein the seal band is disposed in the notch.

11. The substrate support assembly of claim 1, wherein a diameter of the seal band is less than an outer diameter of the electrostatic chuck.

12. The substrate support assembly of claim 11, wherein the diameter of the seal band is less than the outer diameter of the cooling plate.

13. The substrate support assembly of claim 1, wherein the indent has a depth between about 0.30 mm and about 0.50 mm.

14. The substrate support assembly of claim 1, wherein the seal band is symmetrical through an imaginary line bifurcating the indent and inner surface.

15. A substrate support assembly, comprising:
    an electrostatic chuck having a workpiece supporting surface, a chuck diameter and a bottom surface;
    a cooling plate having a top surface and a cooling plate diameter; and
    a bonding layer securing the bottom surface of the electrostatic chuck and the top surface of the cooling plate, wherein the bonding layer comprises:
    an adhesive layer; and
    a seal band circumscribing the adhesive layer and contacting the electrostatic chuck and the cooling plate, the seal band having a ring shaped body with an outer diameter less than the chuck diameter or cooling plate diameter and between about 306 mm and about 310 mm, the ring shaped body formed from a perfluoroelastomer void of fillers having a Shore D hardness between about 60 and 80 and a tensile strength between 10 Mpa and about 15 Mpa, the ring shaped body comprising:
    an inner surface;
    a top surface and a bottom surface, each of the top surface and the bottom surface extend from the inner surface at an angle of more than 110° from the inner surface, wherein about 40% to about 60% of a length of the top surface is configured to abut the bottom surface of the electrostatic chuck; and an outer surface having an indent formed therein, the outer surface connecting the top surface to the bottom surface, wherein the indent forms a profile in the seal band having a V-shape.

16. The substrate support assembly of claim 15, wherein the ring shaped body of the seal band further comprises:
a profile having a V-shaped.

17. The substrate support assembly of claim 15, wherein a compression load on the seal band at 0° Celsius is about 0.23 N/mm, at 25° Celsius the compression load on the seal band is about 0.26 N/mm, and at 50° Celsius the compression load on the seal band is about 0.15 N/mm.

18. The substrate support assembly of claim 15 further comprising:
a notch formed between an outer periphery of the adhesive layer and the outer diameter of the electrostatic chuck, wherein the seal band is disposed in the notch.

19. The substrate support assembly of claim 15, wherein the indent has a depth between about 0.30 mm and about 0.50 mm.

20. The substrate support assembly of claim 15, wherein the seal band is symmetrical through an imaginary line bifurcating the indent and inner surface.

* * * * *